(12) United States Patent
Dong et al.

(10) Patent No.: US 10,840,125 B2
(45) Date of Patent: Nov. 17, 2020

(54) MEMORY STRUCTURE AND METHOD FOR FORMING THE SAME

(71) Applicant: Yangtze Memory Technologies Co., Ltd., Wuhan (CN)

(72) Inventors: Jin Wen Dong, Wuhan (CN); Jun Chen, Wuhan (CN); Zhiliang Xia, Wuhan (CN); Zi Qun Hua, Wuhan (CN); Jifeng Zhu, Wuhan (CN); He Chen, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/127,141

(22) Filed: Sep. 10, 2018

(65) Prior Publication Data

US 2020/0035542 A1   Jan. 30, 2020

Related U.S. Application Data

(63) Continuation of application No. PCT/CN2018/097349, filed on Jul. 27, 2018.

(51) Int. Cl.
| | |
|---|---|
| *H01L 27/11* | (2006.01) |
| *H01L 21/762* | (2006.01) |
| *H01L 23/48* | (2006.01) |
| *H01L 21/768* | (2006.01) |
| *H01L 27/11524* | (2017.01) |
| *H01L 27/11529* | (2017.01) |
| *H01L 27/115* | (2017.01) |
| *H01L 25/18* | (2006.01) |

(52) U.S. Cl.
CPC .. *H01L 21/76224* (2013.01); *H01L 21/76898* (2013.01); *H01L 23/481* (2013.01); *H01L 27/11524* (2013.01); *H01L 27/11529* (2013.01); *H01L 25/18* (2013.01); *H01L 27/115* (2013.01)

(58) Field of Classification Search
CPC ......... H01L 21/76224; H01L 27/11524; H01L 27/11529; H01L 21/76898; H01L 23/481; H01L 27/115; H01L 25/18; G11C 17/02
See application file for complete search history.

(56) References Cited

U.S. PATENT DOCUMENTS

| | | | | |
|---|---|---|---|---|
| 10,170,493 | B1* | 1/2019 | Greenlee | H01L 27/11565 |
| 10,224,407 | B2* | 3/2019 | Chowdhury | H01L 21/28158 |
| 10,453,854 | B2* | 10/2019 | Kanno | H01L 27/11575 |
| 10,600,682 | B2* | 3/2020 | Matovu | H01L 21/76819 |
| 2009/0294821 | A1* | 12/2009 | Yun | H01L 27/0688 257/314 |

(Continued)

*Primary Examiner* — Charles D Garber
*Assistant Examiner* — S M Sohel Imtiaz
(74) *Attorney, Agent, or Firm* — Winston Hsu

(57) ABSTRACT

The present invention relates to a memory structure and a method for forming the same. The memory structure includes a first substrate and an isolation structure. The first substrate includes a substrate layer and a storage layer. The substrate layer has a first surface and a second surface opposite to the first surface. The storage layer is disposed on the first surface of the substrate layer. The substrate layer has a doped well. The isolation structure penetrates through the substrate layer and is disposed at an edge of the doped well for isolating the doped well and the peripheral substrate layer. The memory structure can avoid current leakage between the doped well and the substrate layer so as to improve the performance.

18 Claims, 4 Drawing Sheets

(56) References Cited

U.S. PATENT DOCUMENTS

| | | | | |
|---|---|---|---|---|
| 2011/0260245 A1* | 10/2011 | Liu | ............... | H01L 29/7816 |
| | | | | 257/337 |
| 2013/0168756 A1* | 7/2013 | Hopkins | ......... | H01L 27/11524 |
| | | | | 257/324 |
| 2015/0054027 A1* | 2/2015 | Clark, Jr. | ......... | H01L 27/0207 |
| | | | | 257/173 |
| 2015/0270333 A1* | 9/2015 | Yang | ............ | H01L 29/36 |
| | | | | 257/337 |
| 2015/0372000 A1* | 12/2015 | Jee | ............. | H01L 27/11521 |
| | | | | 257/314 |
| 2016/0365351 A1* | 12/2016 | Nishikawa | ......... | H01L 27/1157 |
| 2017/0125430 A1* | 5/2017 | Nishikawa | ....... | H01L 27/11573 |
| 2019/0035799 A1* | 1/2019 | Shu | ............. | H01L 29/66689 |
| 2019/0237475 A1* | 8/2019 | Jung | ........... | H01L 27/11582 |

\* cited by examiner

MEMORY STRUCTURE AND METHOD FOR FORMING THE SAME

CROSS REFERENCE TO RELATED APPLICATIONS

This patent application is a continuation of international application PCT/CN2018/097349 filed Jul. 27, 2018, the entire contents of which is incorporated herein by reference.

BACKGROUND OF THE INVENTION

1. Field of the Invention

The present disclosure relates to semiconductor technology, and more particularly, to a memory structure and a method for forming the memory structure.

2. Description of the Prior Art

Recently, the development of flash memory grows rapidly. The main feature of flash memory is that it can store information for a long time without being applied by voltage, and it has advantages such as high integration, high access speed, and easy to erase and rewrite, thus it is widely applied in the fields of microelectromechanical systems (MEMS), automatic control and so on. In order to further increase the bit density of flash memory and decrease the bit cost at the same time, three-dimensional flash memory (3D NAND) technology develops rapidly.

A 3D NAND flash memory structure includes a storage array structure and a CMOS circuit structure disposed above the storage array structure. The storage array structure and the CMOS circuit structure are usually formed respectively on two different wafers, and then the wafer having the CMOS circuit is bonded to the top of the storage array structure through a bonding process, so as to connect the CMOS circuit and the storage array circuit. Then, a back of the wafer where the storage array structure is disposed is thinned, and a contact part penetrating through the back is formed to connect the whole circuit outward to an external element. During a thinning process of the back of the wafer, if a doped deep well in the wafer is reached or a thickness of the substrate remained under the doped deep well is too small, a serious leakage may occur between the doped deep well and the substrate In prior arts, in order to decrease leakage current, generally the depth of the doped well has to be strictly controlled and a sufficient thickness of the substrate under the doped deep well has to be remained. However, the methods in prior arts require strict process control, resulted in that the process window is small and a process deviation may cause huge amount of scrapped wafers. Moreover, it is necessary to penetrate through silicon at the back of the wafer to form a through contact part for connecting the circuit outward, and therefore an aspect ratio of the through contact part may be increased when the thickness remained under the doped well is increased, which increases the difficulty of the process. Furthermore, to increase the thickness remained under the doped well may cause the increase of a parasitic capacitance of bonding pads electrically connected to the circuit, thus the performance of the products is affected.

SUMMARY OF THE INVENTION

The present invention provides a memory structure and a method for forming the memory structure, so as to avoid leakage current between the doped well and the substrate.

The present invention provides a memory structure including a first substrate. The memory structure includes a substrate layer and a storage layer, wherein the substrate layer has a first surface and a second surface corresponding to the first surface, the storage layer is disposed on the first surface of the substrate layer, and the substrate layer has a doped well; and an isolation structure penetrating through the substrate layer, wherein the isolation structure is disposed at an edge of the doped well and surrounds the doped well for isolating the doped well from the substrate layer at a periphery of the isolation structure.

Selectively, a sidewall of at least one side of the isolation structure is connected to the doped well.

Selectively, a first contact part is formed in the isolation structure for connecting to a first-type doped well, and the first contact part is disposed at a surface of the first-type doped well surrounded by the isolation structure.

Selectively, the isolation structure includes an isolation trench penetrating through the substrate layer and an isolation material filling the isolation trench.

Selectively, the first substrate further includes a dielectric layer disposed on the second surface of the substrate layer, and the isolation structure penetrates through the dielectric layer.

Selectively, the memory structure further includes: a second contact part penetrating through the dielectric layer and the substrate layer, wherein the second contact part includes a metal pillar and an insulating side-wall disposed on a sidewall surface of the metal pillar.

Selectively, a bottom portion of the doped well is disposed in the substrate layer and has a spacing with the second surface of the substrate layer.

Selectively, the second surface of the substrate layer exposes a bottom surface of the doped well.

Selectively, the doped well includes a first-type doped well and a second-type doped well which is disposed in the first-type doped well.

Selectively, the memory structure further includes a second substrate, wherein a peripheral circuit is formed in the second substrate, the second substrate is disposed on a surface of the storage layer, a storage unit and a storage circuit structure connected to the storage unit are formed in the storage layer, and the peripheral circuit in the second substrate and the storage circuit structure in the storage layer are electrically connected.

The present invention also provides a method of forming a memory structure which includes: providing a first substrate, wherein the first substrate includes a substrate layer and a storage layer, the substrate layer has a first surface and a second surface opposite to the first surface, the storage layer is disposed on the first surface of the substrate layer, and the substrate layer has a doped well; and forming an isolation structure penetrating through the substrate layer, wherein the isolation structure is disposed at an edge of the doped well and surrounds the doped well for isolating the doped well from the substrate layer at a periphery of the isolation structure.

Selectively, a sidewall of at least one side of the isolation structure is connected to the doped well.

Selectively, a first contact part is formed in the storage layer for connecting to a first-type doped well, and the first contact part is disposed at a surface of the first-type doped well surrounded by the isolation structure.

Selectively, the step of forming the isolation structure penetrating through the substrate layer further includes forming an isolation trench penetrating through the substrate layer, wherein the isolation trench is disposed at the edge of the doped well and surrounds the doped well; and filling an isolation material the isolation trench.

Selectively, the method of forming a memory structure further includes forming a dielectric layer on the second surface of the substrate layer, wherein the isolation structure further penetrates through the dielectric layer.

Selectively, the method of forming a memory structure further includes forming a second contact part penetrating through the dielectric layer and the substrate layer.

Selectively, the method of forming the second contact part and the isolation structure includes etching the dielectric layer by taking the substrate layer as an etching stop layer, and forming a first opening and a second opening in the dielectric layer; etching the substrate layer along the first opening and the second opening at the same time and respectively forming the isolation trench and a contact hole penetrating through the substrate layer; forming an insulating material layer filling the isolation trench and the first opening and covering the contact hole and an inner surface of the second opening; removing a portion of the insulating material layer disposed at a bottom portion of the contact hole; and forming a metal material layer filling the contact hole and the second opening, and performing a planarization process to the metal material layer by taking the dielectric layer as a stop layer.

Selectively, a bottom portion of the doped well is disposed in the substrate layer, the bottom portion of the doped well has a spacing with the second surface of the substrate layer or the second surface of the substrate layer exposes a bottom surface of the doped well.

Selectively, the doped well includes a first-type doped well and a second-type doped well which is disposed in the first-type doped well.

Selectively, a second substrate is further disposed on the storage layer, wherein a peripheral circuit is formed in the second substrate, the second substrate is disposed on a surface of the storage layer, a storage unit and a storage circuit structure connected to the storage unit are formed in the storage layer, and the peripheral circuit in the second substrate and the storage circuit structure in the storage layer are electrically connected.

An isolation structure is formed in the substrate layer of the memory structure of the present invention and serves as a physical isolation structure between the doped well and the peripheral substrate, so as to avoid a leakage current occurred between the doped well and the substrate layer peripheral to the isolation structure, and thus the performance of the memory structure may be improved. A thick substrate is not required below the bottom portion of the doped well, a total thickness of the substrate layer is small, and a parasitic capacitance between the bonding pad(s) or other electrical connection structure(s) formed on the dielectric layer and the storage layer may be decreased and thus the performance of the memory structure is improved.

In the forming method of the memory structure in the present invention, when forming the contact part that penetrates through the substrate layer and is connected to the storage layer, an isolation structure between the doped well and the peripheral substrate is formed at the same time, no additional processing step is required, and in the case that the manufacturing cost is not increased, a leakage current problem between the doped well and the peripheral substrate may be avoided, which is beneficial to improve the performance of the memory structure.

These and other objectives of the present invention will no doubt become obvious to those of ordinary skill in the art after reading the following detailed description of the preferred embodiment that is illustrated in the various figures and drawings.

DETAILED DESCRIPTION

A memory structure and a forming method of the memory structure according embodiments of the present invention may be understood by reference to the following detailed description, taken in conjunction with the drawings as described below.

Referring to FIG. 1 to FIG. 6, FIG. 1 to FIG. 6 are structural schematic diagrams of a forming process of a memory structure according to an embodiment of the present invention.

Figure 1:
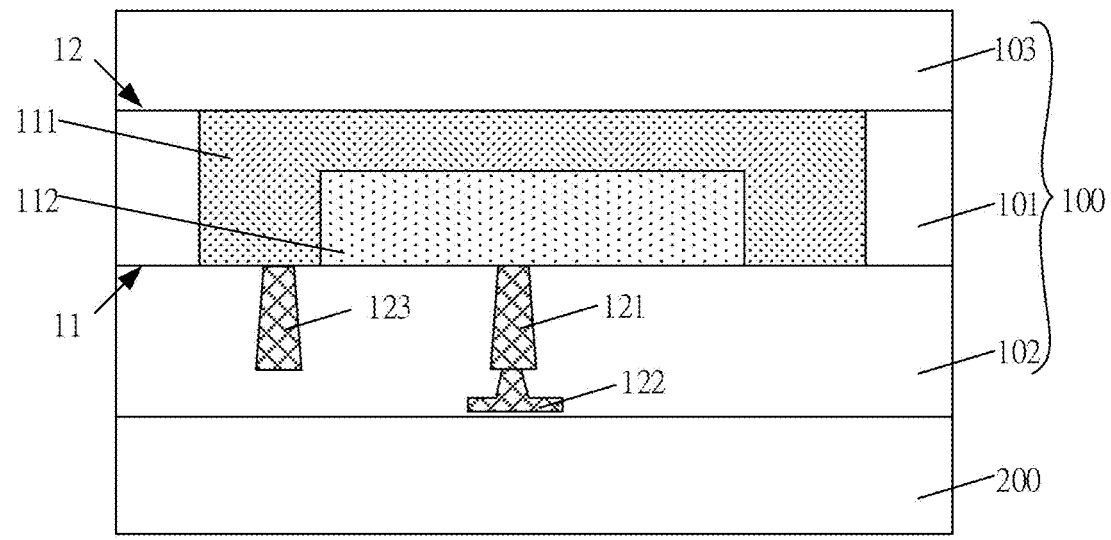
FIG. 1 to FIG. 6 are structural schematic diagrams of a forming process of a memory structure according to an embodiment of the present invention.

Referring to FIG. 1, a first substrate 100 which includes a substrate layer 101 and a storage layer 102 is provided. The substrate layer 101 has a first surface 11 and a second surface 12 opposite to the first surface 11. The storage layer 102 is disposed on the first surface 11 of the substrate layer 101. A substrate layer 101 has a doped well positioned therein.

In FIG. 1, the first substrate 100 is in an upside down placement. In such placement, the first surface 11 of the substrate layer 101 is the lower surface of the substrate layer 101, and the second surface 12 is the upper surface of the substrate layer 101. The storage layer 102 covers the first surface 11 of the substrate layer 101. In the upside down placement, the corresponding storage layer 102 is also disposed under the substrate layer 101. However, the descriptions of relative positions such as upper side, lower side, top portion and bottom portion are referred to an upright placement of the first substrate 100 in the embodiments of the present invention.

The substrate layer 101 is a semiconductor material layer, which may be a single-crystalline silicon wafer, a single-crystalline silicon wafer with a semiconductor epitaxial layer disposed on a surface of the wafer, or a silicon on insulator (SOI) substrate. In the present embodiment, the substrate layer 101 includes a single-crystalline silicon wafer and a single-crystalline silicon epitaxial layer disposed on a surface of the single-crystalline silicon substrate. The surface of the single-crystalline epitaxial layer is a first surface 11, and a surface at another side of the single-crystalline silicon wafer is a second surface 12.

The doped well is formed by performing an ion implantation process to the first surface 11 of the substrate layer 101. According to the ion-implanting direction, a top portion of the doped well is closer to the first surface 11, and a bottom portion of the doped well is closer to the second surface 12. A surface of the top portion of the doped well and the first surface 11 of the substrate layer 101 are coplanar. In one embodiment, the doped well includes a first-type doped well 111 and a second-typed doped well 112 disposed in the first-type doped well 111. In one embodiment, the first-type doped well 111 is an N-type doped well, and the second-type doped well 112 is a P-type doped well. Furthermore, the second-type doped well 112 is a P-type doped well, and the first-type doped well 111 includes the N-type doped well at two sides of the P-type doped well and an N-type doped deep well which is disposed under the N-type doped well and the P-type doped well.

A plurality of doped wells may be formed in the substrate layer 101, and a certain spacing exists between adjacent doped wells. The substrate layer 101 may be formed by performing a thinning process to the back of a wafer having a doped well. A distance between a bottom portion of the doped well and the second surface 12 of the substrate layer 101 may be adjusted according to the degree of thinning.

In the present embodiment, the second surface 12 of the substrate layer 101 exposes the bottom surface of the first-type doped well 111. The thinning process to the back of the wafer is performed until the first-type doped well 111 is exposed.

In another embodiment, the first-type doped well 111 is disposed inside the substrate layer 101, and the bottom surface of the first-type doped well 111 has a spacing with the second surface 12 of the substrate layer 101. A substrate having a certain thickness is positioned between the bottom portion of the first-type doped well 111 and the second surface 12 of the substrate layer 101.

The storage layer 102 includes an insulating layer, a storage unit formed in the insulating layer and a storage circuit connected to the storage unit. In one embodiment, 3D NAND storage units are formed in the storage layer 102, and all of the storage units are formed on a surface of a top portion of the second-type doped well 112. The storage layer 102 further includes a through array contact part 121 penetrating through the storage unit and an interconnect layer 122 connected to the through array contact part 121. In FIG. 1, only one through array contact part 121 and a portion of the interconnect layer 122 are shown for illustration. In a practical memory structure, a plurality of through array contact parts 121 may be formed in each of the storage units.

In the present embodiment, the first substrate 100 further includes a dielectric layer 103 disposed on the second surface 12 of the substrate layer 101. The dielectric layer 103 serves as a passivation layer that covers the second surface 12 of the substrate layer 101 for protecting the second surface 12 of the substrate layer 101. The material of the dielectric layer 103 may be insulating dielectric materials such as TEOS, silicon nitride, silicon oxynitride and silicon oxide. The dielectric layer 103 may be a single-layer structure or a multilayer stack structure. The dielectric layer 103 may be formed by various deposition processes such as chemical vapor deposition process, spin coating process, atomic layer deposition process and so on.

A surface at another side of the storage layer 102 which is opposite to the substrate layer 101 is further bonded to a second substrate 200. A peripheral circuit is formed in the second substrate 200. The second substrate 200 is disposed on the surface of the storage layer 102. The peripheral circuit in the second substrate 200 is electrically connected to the storage circuit in the storage layer 102. Specifically, a surface of the second substrate 200 which faces the storage layer 102 exposes a surface of connecting part of the peripheral circuit, and the surface of the storage layer 102 exposes a surface of a connecting part of the storage circuit, wherein the above two connecting parts are bonded and thus are electrically connected to each other.

Figure 2:
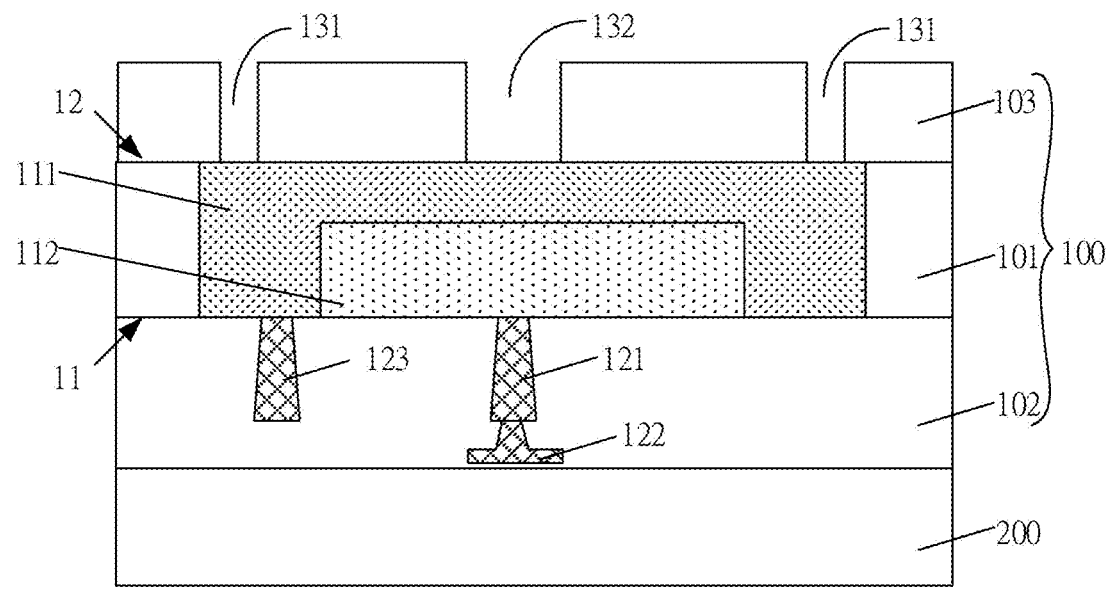

Referring to FIG. 2, the dielectric layer 103 is etched until reaching the second surface 12 of the substrate layer 101, and first opening 131 and a second opening 132 are formed in the dielectric layer 103.

Specifically, a method of forming the first opening 131 and the second opening 132 includes: forming a photoresist layer on the surface of the dielectric layer 103 and performing a lithography process to the photoresist layer through a photomask so as to form a patterned photoresist layer; and using the patterned photoresist layer as a mask layer to etch the dielectric layer 103 to form the first opening 131 and the second opening 132. The first opening 131 is used to define the position and size of an isolation structure subsequently formed, and the second opening 132 is used to define the position and size of a contact part penetrating through the substrate layer 101 subsequently formed. Using the same photomask to perform a lithography process for forming a patterned photoresist layer on the dielectric layer 103 and then etching the dielectric layer 103 to form the second opening 132 and the first opening 131 at the same time needs no additional processing step for the isolation structure.

The first opening 131 has an annular-trench shape; the second opening 132 has a hole shape which may be a round shape, a rectangular shape, a polygon shape and so on in a sectional view.

Figure 3:
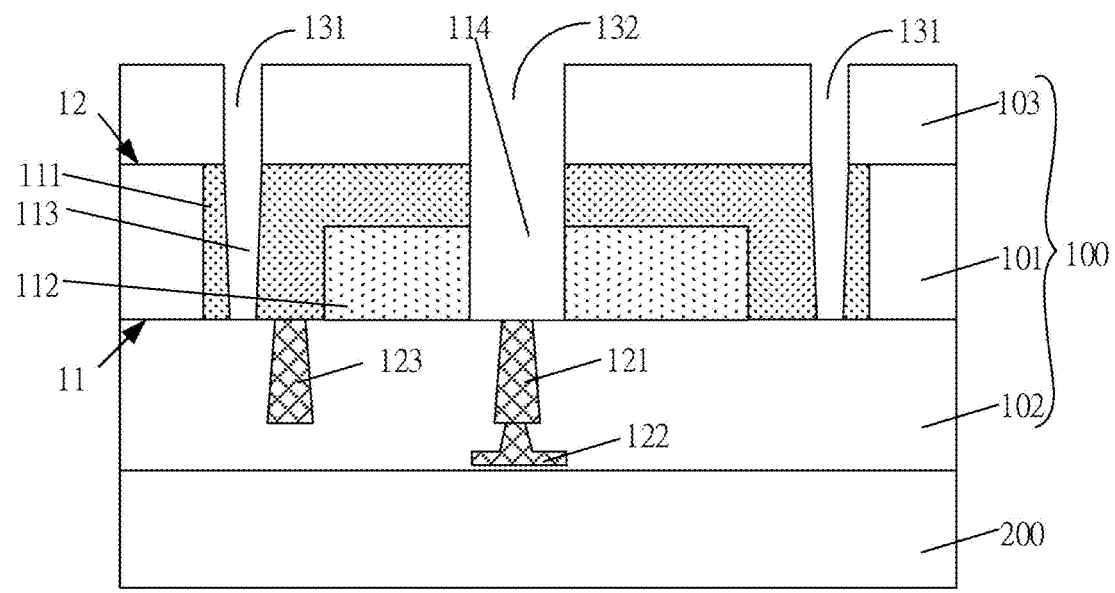

Referring to FIG. 3, the substrate layer 101 is etched along the first opening 131 and the second opening 132 at the same time, and an isolation trench 113 and a contact hole 114 penetrating the substrate layer 101 are respectively formed.

A bottom portion of the contact hole 114 exposes an electrical connection structure in the storage layer 102, and a second contact part penetrating the substrate layer 101 is subsequently formed in the contact hole 114 and is in connection with the electrical connection structure of the storage layer 102. In the present embodiment, FIG. 3 only shows one contact hole 114 is formed for illustration, wherein the contact hole 114 penetrates through the doped well, and the bottom portion of the contact hole 114 exposes the through array contact 121 in the storage layer 102. In other embodiments, a plurality of contact holes 114 can be formed, and a portion of the contact holes 114 may be disposed at a periphery of the doped well and expose the external electrical connection structure with reference to the storage layer.

The sidewall of at least one side of the isolation trench 113 is connected to the doped well. The isolation trench 113 is disposed at an edge of the isolation trench 113 and surrounds the doped well. In the present embodiment, the isolation trench 113 is disposed in the first-type doped well 111, and the sidewalls at two sides of the isolation trench 113 both expose the first-type doped well 111. In another embodiment, only one sidewall of one side of the isolation trench 113 exposes the first-type doped well 111, and another sidewall at another side of the isolation trench 113 exposes the substrate layer 101.

In another embodiment, the isolation trench 113 has a certain spacing with an edge of the first-type doped well 111, and a certain thickness of silicon exists between the first-type doped well 111 and an isolation structure subsequently formed in the isolation trench 113. Although a portion of the substrate material exists between the isolation structure subsequently formed in the isolation trench 113 and the first-type doped well 111, there is still no conductive pathway formed in the portion of substrate layer 101 between the isolation structure and the first-type doped well 111 when the memory device is in operation because the substrate layer 101 at periphery of the isolation trench 113 is grounded. Therefore, no leakage current may occur.

A width of the isolation trench 113 is less than a width of the contact hole 114. In an embodiment of the present invention, the width of the isolation trench 113 is less than a half of an aperture width of the contact hole 114 and is greater than 20 nm. The maximum of the aperture width of the contact hole 114 may be 1500 nm.

Figure 4:
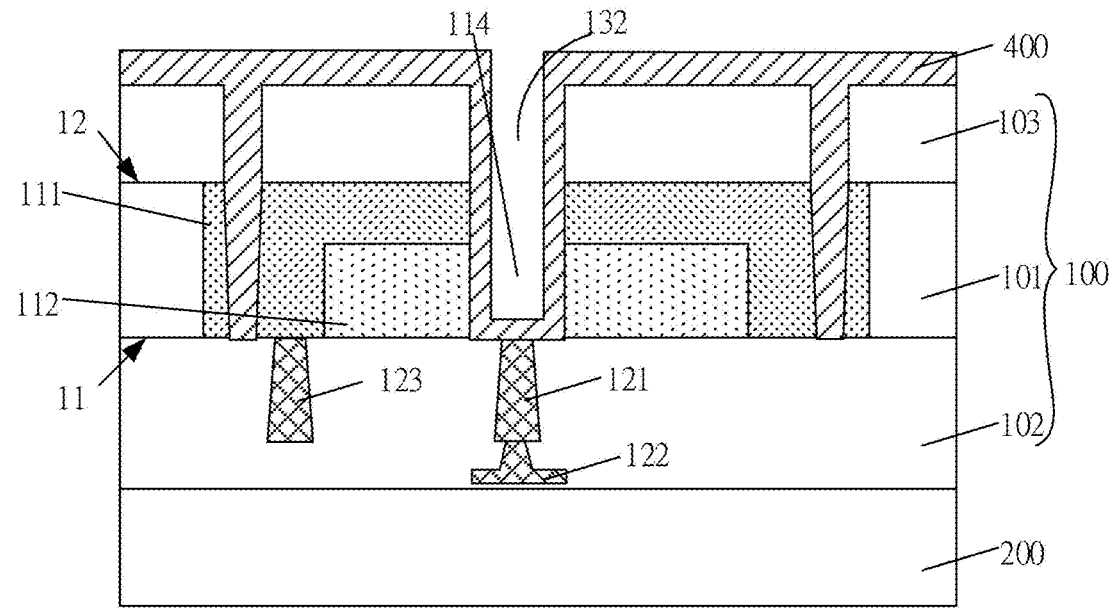

Referring to FIG. 4, an insulating material layer 400 is formed to fill the isolation trench 113, the first opening 131 and cover inner sidewall surfaces of the contact hole 114 and the second opening 132.

The material of the insulating material layer 400 may be insulating dielectric materials such as silicon oxide, silicon oxynitride and silicon nitride. The insulating material layer 400 may be formed by deposition processes such as chemical vapor deposition process, atomic layer deposition process, and plasma chemical-vapor deposition process and so on. Since the width of the isolation trench 113 is less than a diameter of the contact hole 114, the isolation trench 113 and the first opening 131 are fully filled with the insulating material layer 400 but the insulating material layer 400 only covers the inner sidewall surfaces of the contact hole 114 and the second opening 132.

The insulating material layer 400 further covers the surface of the dielectric layer 103.

Figure 5:
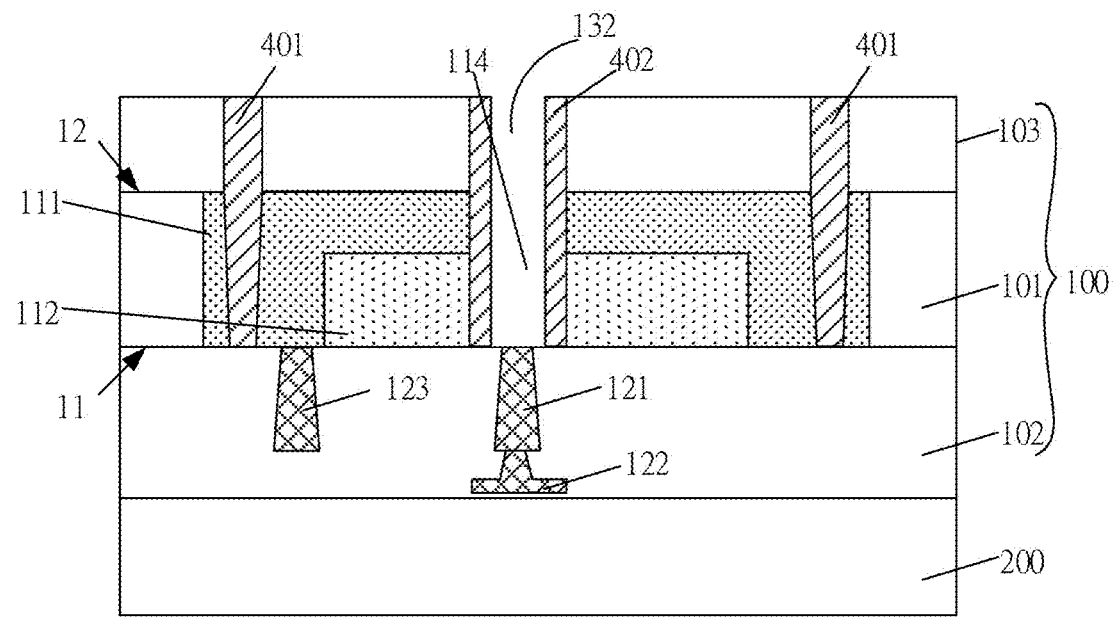

Referring to FIG. 5, the insulating material layer 400 at the bottom portion of the contact hole 114 is removed, and an insulating side-wall which covers the sidewalls of the contact hole 114 and the second opening 132 are formed. The insulating material layer filling the isolation trench 113 and the first opening 131 serves as an isolation structure 401.

An anisotropic etching process is used to remove the insulating material layer 400 at the bottom portion of the contact hole 114. When removing the insulating material layer 400 at the bottom portion of the contact hole 114, the insulating material layer 400 on the surface of the dielectric layer 103 is also removed at a same time. In other embodiments, after the insulating material layer 400 at the bottom portion of the contact hole 114 is removed, the insulating material layer 400 with a certain thickness is remained on the surface of the dielectric layer 103.

At least one sidewall of the isolation structure 401 is connected to the doped well. In the present embodiment, the isolation structure 401 is entirely disposed in the first-type doped well 111 and is close to an edge of the first-type doped well 111. Therefore, two sidewalls of the isolation structure 401 are connected to the first-type doped well 111. Most of the first-type doped well 111 and the second-type doped well 112 are surrounded by the isolation structure 401, and through the isolation structure 401, an physical isolation between the doped well region surrounded by the isolation structure 401 and the peripheral substrate layer 101 is materialized.

In another embodiment, a sidewall of one side of the isolation structure 401 is connected to the first-type doped well 111, and another sidewall at another side of the isolation structure 401 is connected to the substrate layer 101 at the periphery of the first-type doped well 111.

In another embodiment, a certain spacing may further exist between the isolation structure 401 and the edge of the first-type doped well, and a substrate material having a certain thickness exists between the first-type doped well 111 and the isolation structure 401. The isolation structure 401 is used to provide an isolation between the region surrounded by the isolation structure 401 and the substrate material at a periphery of the isolation structure 401.

Since the substrate layer 101 is grounded and the isolation structure 401 serves as an physical isolation structure when the memory is in operation, a leakage current occurring between the first-type doped well 111 and the substrate layer 101 at the periphery of the isolation structure 401 may be avoided and therefore the performance of the memory is improved.

Although a depletion layer may be formed to decrease leakage current if the first-type doped well 111 is in direct contact with the peripheral substrate layer 101 are indirect contact, a sufficient thickness of the depletion layer is required to entirely avoid producing leakage current. In such case, an undoped substrate with a greater thickness is required at the periphery of the first-type doped well 111, and therefore the thickness of the substrate layer is required to be greater. In contrast, in the present embodiment of present invention, since a physical isolation between the first-type doped well 111 and the peripheral substrate layer 101 is formed through disposing the isolation structure 401, no isolation through a depletion layer is required. Therefore, the second surface 12 of the substrate layer 101 may be thinned to expose the bottom surface of the first-type doped well 111. In other embodiments, a substrate material with a certain thickness may still exist between the bottom surface of the first-type doped well 111 and the second surface 12, and a distance between the bottom surface of the first-type doped well 111 and the second surface 12 may be small, such as being less than 1 μm, thus the substrate layer 101 has a smaller thickness.

In the present embodiment, when forming the insulating side-wall 402, the isolation structure 401 is formed and no additional processing step is required.

A first contact part 123 which is connected to the first-type doped well 111 may be formed in the storage layer 102. The first contact part 123 is disposed at the surface of a top portion of the first-type doped well 111 surrounded by the isolation structure 401.

Figure 6:
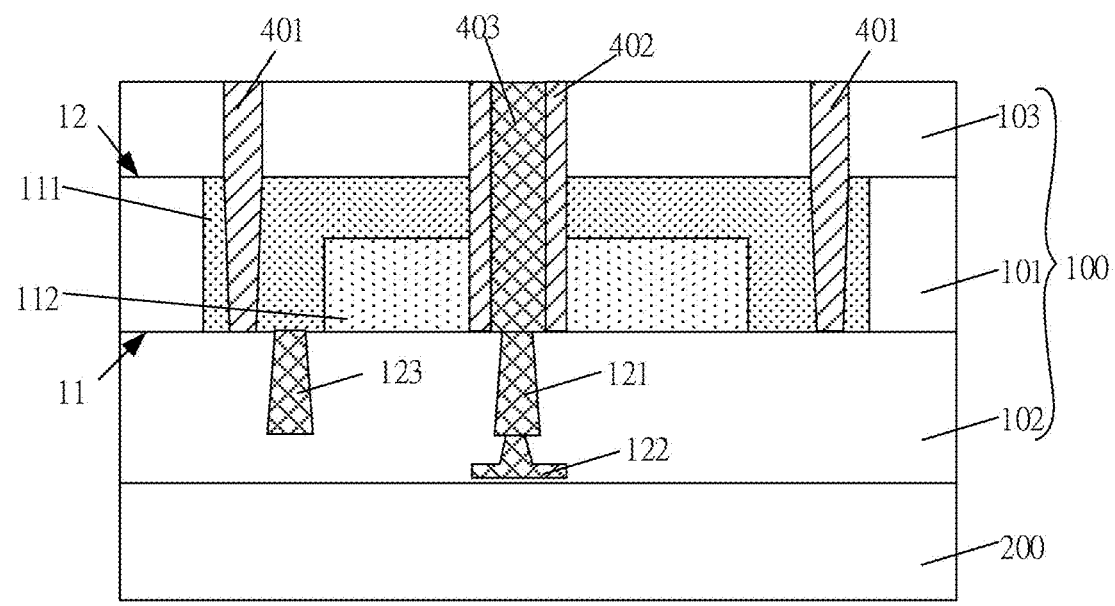

Referring to FIG. 6, a metal material layer is formed to fill the contact hole 114 and the second opening 132, and a planarization process is performed to the metal material layer by taking the dielectric layer 103 as a stop layer, so as to form a metal pillar 403 in the contact hole 114 and the second opening 132. The insulating side-wall 402 and the metal pillar 403 form a second contact part.

The material of the metal material layer may be metal materials such as W, Cu, Al, Au and so on. The metal material layer may be formed by physical vapor deposition process such as sputtering process.

A planarization process is performed to the metal material layer to remove the metal material layer on the surface of the dielectric layer 103, and the metal pillar 403 is formed. The metal pillar 403 is connected to the through array contact part 121 of the storage layer 102, such that the metal pillar 403 is connected to the storage circuit in the storage layer 102.

Subsequently, a step of forming bonding pad(s) or other electrical connection structure(s) connected to the metal pillar 403 on the surface of the dielectric layer 103 is further included. Since in the present embodiment, an isolation structure 401 is formed in the substrate layer 101 and serves as a physical isolation structure between the doped well and the peripheral substrate, a thick substrate is not required below the bottom portion of the doped well, such that the total thickness of the substrate layer 101 is smaller. Accordingly, a parasitic capacitance between the bonding pad(s) or other electrical connection structure(s) formed on the dielectric layer 103 and the storage layer 102 may be decreased and the performance of the memory structure is improved.

In another embodiment, before the dielectric layer 103 is formed, an isolation structure may first be formed by etching the substrate layer 101 to form an isolation trench and filling the isolation trench with isolation material before the dielectric layer 103 is formed. And then, the dielectric layer 103 is formed on the second surface 12 of the substrate layer 101, the dielectric layer 103 and the substrate layer 101 is etched to form a contact hole penetrating through the dielectric layer 103 and the substrate layer 101. After that, the insulating side-wall 402 is formed on the surface of the inner sidewall of the contact hole, and the metal pillar 403 filling the contact hole is formed.

A memory structure formed by the aforementioned method is further provided in an embodiment of the present invention.

Referring to FIG. 6, FIG. 6 is a structural schematic diagram of a memory structure according to an embodiment of the present invention.

The memory structure includes: a first substrate 100 including a substrate layer 101 and a storage layer 102, wherein the substrate layer 101 has a first surface 11 and a second surface 12 opposite to the first surface 11, the storage layer 102 is disposed on the first surface 11 of the substrate layer 101, and the substrate layer 101 has a doped well; and an isolation structure 401 penetrating through the substrate layer 101 and disposed at an edge of the doped well for isolating the doped well from the peripheral substrate layer 101.

The substrate layer 101 is a semiconductor material layer, which may be a single-crystalline silicon wafer, a single-crystalline silicon wafer with a semiconductor epitaxial layer disposed on a surface of the single-crystalline silicon wafer, or a silicon-on-insulator substrate. In the present embodiment, the substrate layer 101 includes a single-crystalline silicon wafer and a single-crystalline silicon epitaxial layer disposed on a surface of the single-crystalline silicon wafer. The surface of the single-crystalline silicon layer is the first surface 11, and the surface at another side of the single-crystalline silicon layer is the second surface 12.

In FIG. 1, the first substrate 100 is in an upside down placement, the first surface 11 of the substrate layer 101 is a lower surface of the substrate layer 101, and the second surface 12 is an upper surface of the substrate layer 101. The storage layer 102 covers the first surface 11 of the substrate layer 101. In the upside down placement, the corresponding storage layer 102 is also positioned under the substrate layer 101.

The doped well is formed by performing an ion implantation process to the first surface 11 of the substrate layer 101. According to the ion-implanting direction, a top portion of the doped well is closer to the first surface, and a bottom portion of the doped well is closer to the second surface 12. A surface of the top portion of the doped well and the first surface 11 of the substrate layer 101 are coplanar. In one embodiment, the doped well includes a first-type doped well 111 and a second-typed doped well 112 which is disposed in the first-type doped well 111. In one embodiment, the first-type doped well 111 is an N-type doped well, and the second-type doped well 112 is a P-type doped well. Furthermore, the second-type doped well is a P-type doped well, and the first-type doped well 111 includes the N-type doped well at two sides of the P-type doped well and an N-type doped deep well which is disposed under the N-type doped well and the P-type doped well.

A plurality of doped wells may be formed in the substrate layer 101, and a certain spacing exists between adjacent doped wells. The substrate layer 101 may be formed by performing a thinning process to the back of a wafer having a doped well. A distance between a bottom portion of the doped well and the second surface 12 of the substrate layer 101 may be adjusted according to the degree of thinning.

In the present embodiment, the second surface 12 of the substrate layer 101 exposes the bottom surface of the first-type doped well 111. The thinning process to the back of the wafer is performed until the first-type doped well 111 is exposed In another embodiment, the first-type doped well 111 is disposed inside the substrate layer 101, and the bottom surface of the first-type doped well 111 has a spacing from the second surface 12 of the substrate layer 101. A substrate having a certain thickness is positioned between the bottom portion of the first-type doped well 111 and the second surface 12 of the substrate layer 101.

The storage layer 102 includes an insulating layer, a storage unit formed in the insulating layer and a storage circuit connected to the storage unit. In one embodiment, 3D NAND storage units are formed in the storage layer 102, and all of the storage units are formed on a surface of the second-type doped well 112. The storage layer 102 further includes a through array contact part 121 penetrating through the storage unit and an interconnect layer 122 connected to the through array contact part 121. In FIG. 1, only one through array contact part 121 and a portion of the interconnect layer 122 are shown for illustration. In a practical memory structure, a plurality of through array contact parts 121 may be formed in each of the storage units.

In the present embodiment, the first substrate 100 further includes a dielectric layer 103 disposed on the second surface 12 of the substrate layer 101. The dielectric layer 103 serves as a passivation layer that covers the second surface 12 of the substrate layer 101 for protecting the second surface 12 of the substrate layer 101. The material of the dielectric layer 103 may be insulating dielectric materials such as TEOS, silicon nitride, silicon oxynitride and silicon oxide. The dielectric layer 103 may be a single-layer structure or a multilayer stack structure. The dielectric layer 103 may be formed by various deposition processes such as chemical vapor deposition process, spin coating process, atomic layer deposition process and so on.

The isolation structure 401 includes an isolation trench penetrating through the substrate layer 101 and an isolation material filling the isolation trench. In the present embodiment, the isolation structure 401 further penetrates through the dielectric layer 103. In another embodiment, the isolation structure 401 may be disposed only in the substrate layer 101.

A sidewall of at least one side of the isolation structure 401 is connected to the doped well. In the present embodiment, the isolation structure 401 is entirely disposed in the first-type doped well 111 and close to an edge of the first-type doped well 111. Therefore, two sidewalls of the isolation structure 401 are both connected to the first-type doped well 111, most of the first-type doped well 111 and the second type-doped well 112 are surrounded by the isolation structure 401, and through the isolation structure 401, an physical isolation between the doped well region surrounded by the isolation structure 401 and the peripheral substrate layer 101 is materialized.

In another embodiment, a sidewall of one side of the isolation structure 401 is connected to the first-type doped well 111, and another sidewall at another side of the isolation structure 401 is connected to the substrate layer 101 at the periphery of the first-type doped well 111.

In another embodiment, a certain spacing may further exist between the isolation structure 401 and the edge of the first-type doped well, and a substrate material having a certain thickness exists between the first-type doped well 111 and the isolation structure 401. The isolation structure 401 is used to provide an isolation between the region surrounded by the isolation structure 401 and the substrate material at a periphery of the isolation structure 401.

Since the substrate layer 101 is grounded and the isolation structure 401 serves as an physical isolation structure when the memory is in operation, a leakage current occurring between the first-type doped well 111 and the substrate layer 101 at the periphery of the isolation structure 401 may be avoided and therefore the performance of the memory is improved. Since the first-type doped well 111 is physically isolated from the peripheral substrate layer 101 by the isolation structure 401, the isolation through a depletion layer is not necessary. Therefore, the second surface 12 of the substrate layer 101 may be thinned to expose the bottom surface of the first-type doped well 111. In other embodiments, a substrate material with a certain thickness may still exist between the bottom surface of the first-type doped well 111 and the second surface 12, and a distance between the bottom surface of the first-type doped well 111 and the second surface 12 may be small, such as being less than 1 μm, thus the substrate layer 101 has a smaller thickness.

A first contact part 123 connected to the first-type doped well 111 may be formed in the storage layer 102. The first contact part 123 is disposed at a top surface of the first-type doped well 111 surrounded by the isolation structure 401.

The memory structure further includes a second contact part penetrating through the dielectric layer 103 and the substrate layer 101. The second contact part includes a metal pillar 403 and an insulating side-wall 402 disposed on a surface of a sidewall of the metal pillar 403. The material of the metal pillar 403 may be metal materials such as W, Cu, Al, Au and so on. The metal pillar 403 is connected to the through array contact part 121, such that the metal pillar 403 is connected to the storage circuit in the storage layer 102.

Since the isolation structure 401 and the second contact part penetrate through the dielectric layer 103 and the substrate layer 101, through etching the dielectric layer 103 and the substrate layer 101, an isolation trench and a contact hole may be formed at the same time. Then, when forming the insulating side-wall 402, the isolation structure 401 filling the isolation trench is also formed and no additional processing step is required.

Bonding pad(s) or other electrical connection structure(s) connected to the metal pillar 403 may further be disposed on the surface of the dielectric layer 103. In the present embodiment, since an isolation structure 401 is formed in the substrate layer 101 and serves as a physical isolation structure between the doped well and the peripheral substrate, a thick substrate is not required below the bottom portion of the doped well. Accordingly, the total thickness of the substrate layer 101 may be smaller, and a parasitic capacitance between the bonding pad(s) or other electrical connection structure(s) formed on the dielectric layer 103 and the storage layer 102 may be decreased and thus the performance of the memory is improved.

A second substrate 200 is further included on the surface of the storage layer 102. A peripheral circuit is formed in the second substrate 200. The second substrate 200 is disposed on the surface of the storage layer 102. The peripheral circuit in the second substrate 200 is electrically connected to the storage circuit in the storage layer 102. Specifically, a surface of the second substrate 200 which faces the storage layer 102 exposes a surface of connecting part of the peripheral circuit, the surface of the storage layer 102 exposes a surface of a connecting part of the storage circuit, and the above two connecting parts are bonded and thus are electrically connected to each other.

Figure 7:
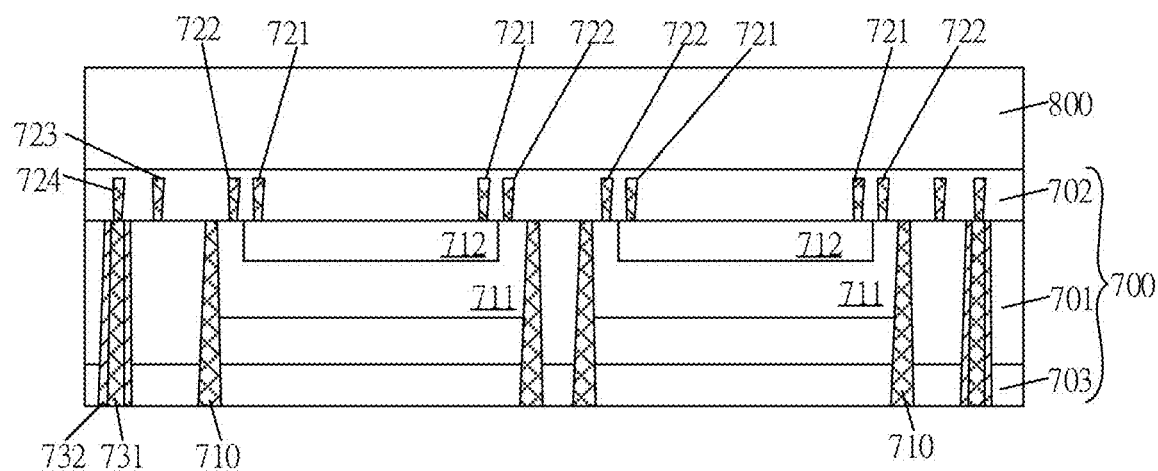
FIG. 7 is a structural schematic diagram of a memory structure according to an embodiment of the present invention.

Referring to FIG. 7, FIG. 7 is a structural schematic diagram of a memory structure according to another embodiment of the present invention.

In the present embodiment, the memory structure includes: a first substrate 700 including a substrate layer 701 and a storage layer 702, wherein the substrate layer 701 has a first surface and a second surface opposite to the first surface, the storage layer 702 is disposed on the first surface on the substrate layer 701, and the first substrate layer 701 has a doped well; and an isolation structure 710 penetrating through the substrate layer 701 and at an edge of the doped well for isolating the doped well from the peripheral substrate layer 701. In FIG. 7, the first substrate 700 is at an upright placement.

A plurality of doped wells is formed in the substrate layer 701. The doped wells include a first-type doped well 711 and a second-type doped well 712 disposed in the first-type doped well 711. A surface of the doped well and the first surface of the substrate layer 701 are coplanar. The substrate layer 701 with a certain thickness is disposed below the bottom portion of the doped well.

The storage layer 702 includes an insulating layer, one or more storage units formed in the insulating layer, and one or more storage circuits connected to the storage units. 3D NAND storage units are formed in the storage layer 702, and all of the storage units are formed on a surface of the second-type doped well 712.

The storage layer 702 further includes through array contact parts 721 penetrating through the storage units, and the through array contact parts 721 are connected to the second-type doped well 712. One or more first contact parts 722 are further formed in the storage layer 702, which are connected to the first-type doped well 711. One or more substrate contact parts 723 are further formed in the storage layer 702 for connecting to the substrate layer 701. One or more circuit connecting parts 724 are further formed in the storage layer 702 for connecting the storage circuits in the storage layer 702 to an external element.

The first substrate 700 further includes a dielectric layer 703 disposed on the second surface of the substrate layer 701. The dielectric layer 703 serves as a passivation layer on the second surface of the substrate layer 701 for protecting the second surface of the substrate layer 701.

An isolation structure 710 penetrates through the dielectric layer 703 and the substrate layer 701. One side of the isolation structure 710 is connected to the first-type doped well 711, so as to surround the first-type doped well 711 and the second-type doped well 712 and isolate the first-type doped well 711 and the second-type doped well 712 from the substrate layer 701 at the periphery of the isolation structure 710. The first contact parts 722 which are connected to the first-type doped well 711 is disposed on a surface of the first-type doped well 111 surrounded by the isolation structure 401.

The memory structure further includes second contact parts penetrating through the dielectric layer 703 and the substrate layer 701. Each second contact part includes a metal pillar 731 and an insulating side-wall 732 disposed on a surface of a sidewall of the metal pillar 731. The metal pillar 731 is connected to one circuit connecting part 724 in the storage layer 702, for connecting to the storage circuit in the storage layer 702. In other embodiments, the memory structure further includes second contact parts connecting to the through array contact parts 721, the first contact parts 722 and the substrate contact parts 723.

The surface of the storage layer 702 further includes a second substrate 800. A peripheral circuit is formed in the second substrate 800. The second substrate 800 is disposed on the surface of the storage layer 702, the peripheral circuit in the second substrate 800 and the storage circuit in the storage layer 702 are electrically connected to each other. Specifically, a surface of the second substrate 800 which faces the storage layer 702 exposes a surface of a connecting part of the peripheral circuit, the surface of the storage layer 702 exposes a surface of a connecting part of the storage circuit, and the above two connecting parts are bonded and thus electrically connected to each other.

The above only describes the preferred embodiments of the present invention, it should be noted that those skilled in the art can make several improvements, modifications and alterations without departing from the principles of the present invention, and it should be considered that these improvements, modifications and alterations are in the scope of protection of the present invention.

What is claimed is:

1. A memory structure, comprising:
   a first substrate, comprising a substrate layer and a storage layer, wherein the substrate layer has a first surface and a second surface opposite to the first surface, the storage layer is disposed on the first surface of the substrate layer, and the substrate layer has a doped well; and
   an isolation structure penetrating through the substrate layer, wherein the isolation structure is disposed at an edge of the doped well and surrounds the doped well for isolating the doped well from the substrate layer at a periphery of the isolation structure;
   wherein a first contact part is formed in the storage layer for connecting to a first-type doped well, and the first contact part is disposed at a surface of the first-type doped well surrounded by the isolation structure.

2. The memory structure according to claim 1, wherein a sidewall of at least one side of the isolation structure is connected to the doped well.

3. The memory structure according to claim 1, wherein the isolation structure comprises an isolation trench penetrating through the substrate layer and an isolation material filling the isolation trench.

4. The memory structure according to claim 1, wherein the first substrate further comprises a dielectric layer disposed on the second surface of the substrate layer, and the isolation structure penetrates through the dielectric layer.

5. The memory structure according to claim 4, further comprising a second contact part penetrating through the dielectric layer and the substrate layer, wherein the second contact part comprises a metal pillar and an insulating side-wall disposed on a sidewall surface of the metal pillar.

6. The memory structure according to claim 1, wherein a bottom portion of the doped well is disposed in the substrate layer and has a spacing with the second surface of the substrate layer.

7. The memory structure according to claim 1, wherein the second surface of the substrate layer exposes a bottom surface of the doped well.

8. The memory structure according to claim 1, wherein the doped well comprises a first-type doped well and a second-type doped well disposed in the first-type doped well.

9. The memory structure according to claim 1, further comprising a second substrate, wherein a peripheral circuit is formed in the second substrate, the second substrate is disposed on a surface of the storage layer, a storage unit and a storage circuit structure connected to the storage unit are formed in the storage layer, and the peripheral circuit in the second substrate and the storage circuit structure in the storage layer are electrically connected.

10. A method of forming a memory structure, comprising:
    providing a first substrate, wherein the first substrate comprises a substrate layer and a storage layer, the substrate layer has a first surface and a second surface opposite to the first surface, the storage layer is disposed on the first surface of the substrate layer, and the substrate layer has a doped well; and
    forming an isolation structure penetrating through the substrate layer, wherein the isolation structure is disposed at an edge of the doped well and surrounds the doped well for isolating the doped well from the substrate layer at a periphery of the isolation structure;
    wherein a first contact part is formed in the storage layer for connecting to a first-type doped well, and the first contact part is disposed at a surface of the first-type doped well surrounded by the isolation structure.

11. The method of forming the memory structure according to claim 10, wherein a sidewall of at least one side of the isolation structure is connected to the doped well.

12. The method of forming the memory structure according to claim 10, wherein the step of forming the isolation structure penetrating through the substrate layer further comprises:
    forming an isolation trench penetrating through the substrate layer, wherein the isolation trench is disposed at the edge of the doped well and surrounds the doped well; and
    filling an isolation material into the isolation trench.

13. The method of forming the memory structure according to claim 10, further comprising forming a dielectric layer on the second surface of the substrate layer, wherein the isolation structure further penetrates through the dielectric layer.

14. The method of forming the memory structure according to claim 13, further comprising forming a second contact part penetrating through the dielectric layer and the substrate layer.

15. The method of forming the memory structure according to claim 14, wherein a method of forming the second contact part and the isolation structure comprises:
    etching the dielectric layer by taking the substrate layer as an etching stop layer, and forming a first opening and a second opening in the dielectric layer;
    etching the substrate layer along the first opening and the second opening at the same time and respectively forming the isolation trench and a contact hole penetrating through the substrate layer;
    forming an insulating material layer filling the isolation trench and the first opening and covering the contact hole and an inner surface of the second opening;
    removing a portion of the insulating material layer disposed at a bottom portion of the contact hole; and
    forming a metal material layer filling the contact hole and the second opening, and performing a planarization process to the metal material layer by taking the dielectric layer as a stop layer.

16. The method of forming the memory structure according to claim 10, wherein a bottom portion of the doped well is disposed in the substrate layer, the bottom portion of the doped well has a spacing with the second surface of the substrate layer or the second surface of the substrate layer exposes a bottom surface of the doped well.

17. The method of forming the memory structure according to claim 10, wherein the doped well comprises a first-type doped well and a second-type doped well disposed in the first-type doped well.

18. The method of forming the memory structure according to claim 10, further comprising a second substrate disposed on the storage layer, wherein a peripheral circuit is formed in the second substrate, the second substrate is disposed on a surface of the storage layer, a storage unit and a storage circuit structure connected to the storage unit are formed in the storage layer, and the peripheral circuit in the second substrate and the storage circuit structure in the storage layer are electrically connected.

* * * * *